United States Patent [19]

Siegal

[11] Patent Number: 4,629,926

[45] Date of Patent: Dec. 16, 1986

[54] MOUNTING FOR PIEZOELECTRIC BENDER OF FLUID CONTROL DEVICE

[75] Inventor: Burton L. Siegal, Skokie, Ill.

[73] Assignee: Kiwi Coders Corporation, Skokie, Ill.

[21] Appl. No.: 775,617

[22] Filed: Oct. 21, 1985

[51] Int. Cl.[4] ............................................ H01L 41/08
[52] U.S. Cl. .................................... 310/331; 310/328; 310/330; 251/129.01
[58] Field of Search .............. 310/328, 330, 331, 332; 137/831, 837; 251/129.01, 129.06, 291, 335.1, 335.2; 116/DIG. 7; 200/181

[56] References Cited

U.S. PATENT DOCUMENTS

| | | | |
|---|---|---|---|
| 3,614,486 | 10/1971 | Smiley | 251/129.06 X |
| 4,011,474 | 3/1977 | O'Neill | 310/328 |
| 4,032,929 | 6/1977 | Fischbeck et al. | 310/328 X |
| 4,072,959 | 2/1978 | Elmqvist | 310/330 X |
| 4,318,023 | 3/1982 | O'Neill et al. | 310/328 |
| 4,450,375 | 5/1984 | Siegal | 310/331 |
| 4,492,360 | 1/1985 | Lee, II et al. | 251/129.01 |

*Primary Examiner*—Patrick R. Salce
*Assistant Examiner*—Emanuel Todd Voeltz

*Attorney, Agent, or Firm*—Silverman, Cass, Singer & Winburn, Ltd.

[57] ABSTRACT

A fluid flow control device of the type wherein piezoelectric spring-like benders operably are associated with impacting members, each capable of deforming a membrane to control flow past a valve seat upon change in the electrical condition of the benders. Each bender and impacting member is isolated from the fluid by the membrane. The benders may be mounted individually arranged side-by-side for multiple use or can be grouped in a comb-like configuration. A mounting is provided for the benders which permits the force exercised on the impacting member by the free end of the bender to be adjusted and maintains the electrical isolation of the benders one from the others. The mounting as installed provides a stationary or an adjustable fulcrum point and a clamping member cooperating with the fulcrum for fixing the adjustment. The mounting maintains the free end of the bender centered over the impacting member, enables initial deflection adjustment and further provides for electrical connection of the benders with a fixed receptacle. Where required, compensation is afforded for any differences in thickness between the assembled benders and the receptacle.

13 Claims, 9 Drawing Figures

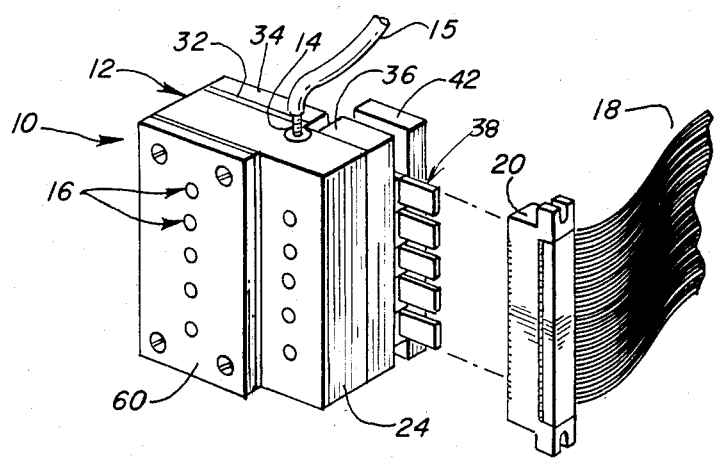
FIG. 1
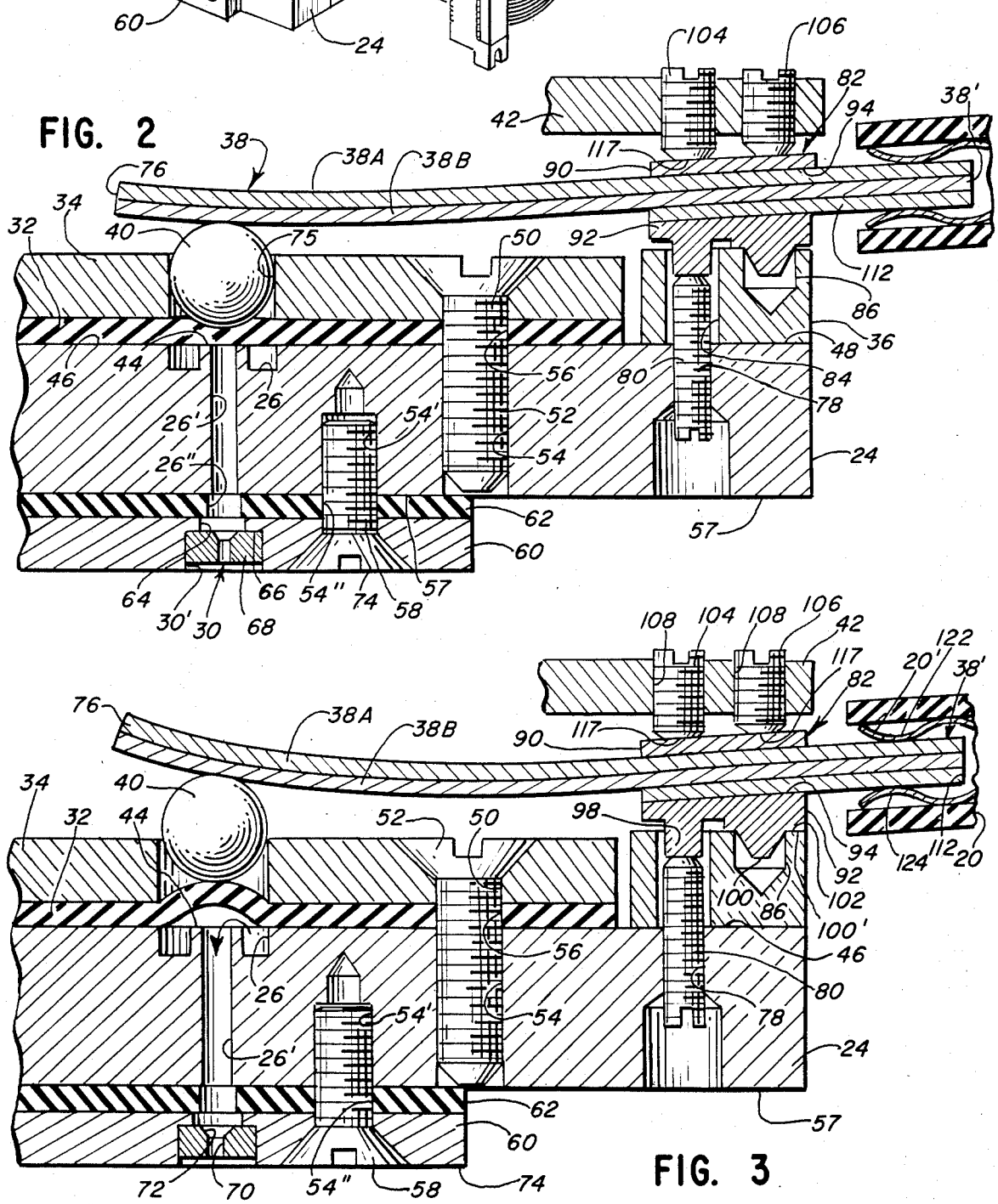
FIG. 2
FIG. 3

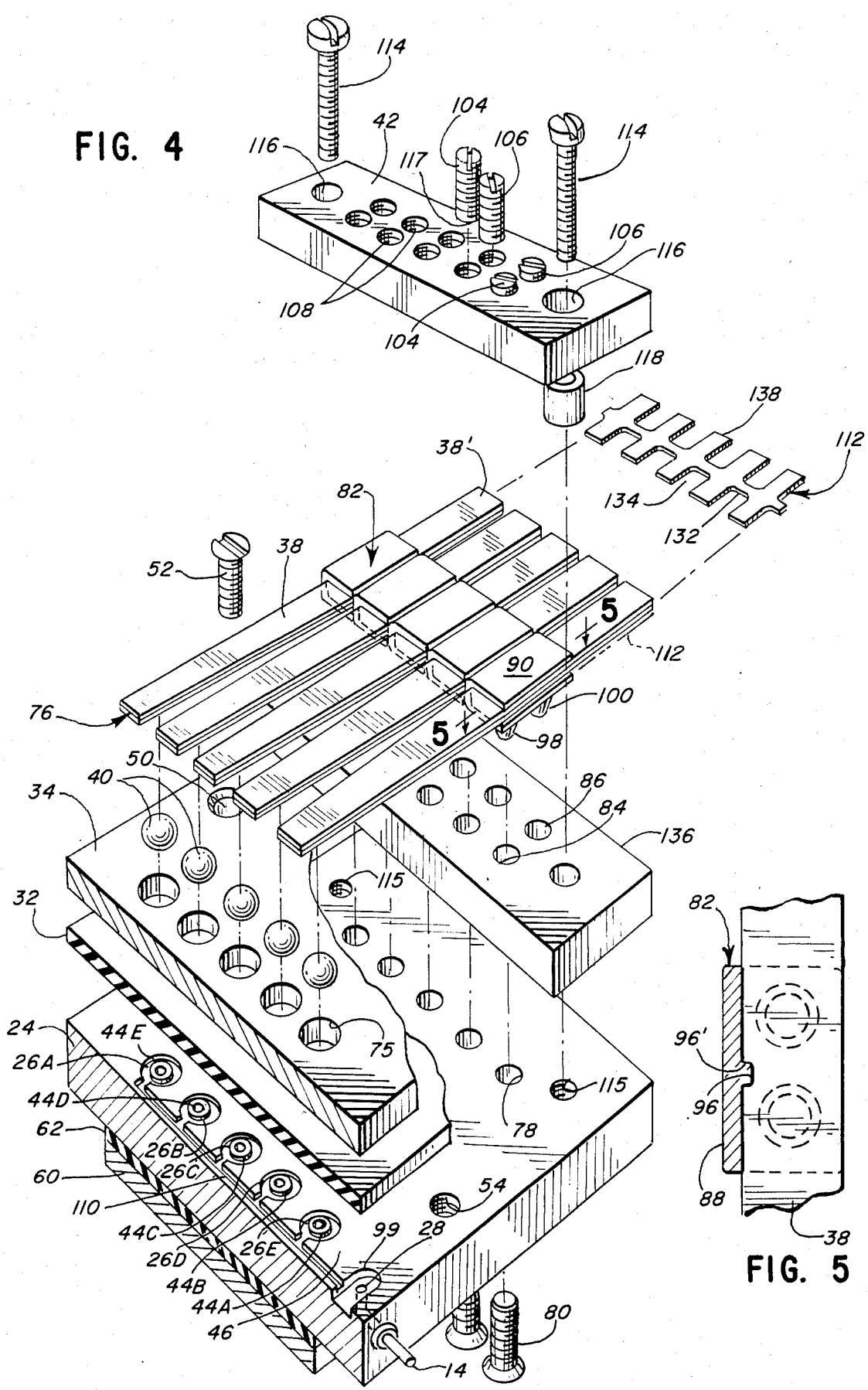

MOUNTING FOR PIEZOELECTRIC BENDER OF FLUID CONTROL DEVICE

CROSS-REFERENCE TO RELATED PATENTS

This invention is an improvement related to my U.S. Pat. No. 4,450,375 granted May 22, 1984 and entitled PIEZOELECTRIC FLUID CONTROL DEVICE and owned by the Assignee hereof, said patent being hereby incorporated by reference herein for the description set forth in the specification and drawings thereof.

BACKGROUND OF THE INVENTION

The invention herein relates generally to piezoelectrically operated fluid control devices of the type wherein plural cantilever mounted piezoelectric benders cooperate with associated impacting members, respectively to deform a membrane to cover and/or uncover a valve seat upon energization or deenergization, both benders and impacting members being isolated from the fluid by the membrane. In particular, the invention is directed to provision of a mounting for seating the benders on the body of the fluid control device to provide secure, accurate placement of the benders, to permit positional adjustment and, further, to provide means for establishing electrical connection to the benders while maintaining electrical isolation thereof from each other.

It is known also to use a stack of piezoelectric discs or wafers as a driver for an undamped spring-mass system. U.S. Pat. No. 3,614,486 discloses the use of a stack of thin piezoelectric discs as a driver for applications which require high speed, accuracy and no vibration.

The known devices position the piezoelectric member in contact with the fluid and require protective coatings on the piezoelectric beam and electrical connections to protect the same from chemical attack by the fluid. Additionally, mechanical problems result from the fluid contact with the piezoelectric member.

The piezoelectric fluid control device disclosed in my earlier U.S. Pat. No. 4,450,375 included multiple ports each with its own valve seat and an actuator, the valve seats being covered by a common deformable membrane. The benders were provided in the same number as the number of ports to impact on the actuator and deform the membrane changing the condition of the valve. Multiple benders were formed individually or in comb configuration as a laminate comprising at least a pair of flat bonded portions including a layer of ceramic piezoelectric material on a supporting electrically conductive stainless steel or the like member of conforming configuration. The fluid control device was characterized by the isolation of the valve actuator (a spherical object) and piezoelectric bender from the fluid whose flow was being controlled by a common diaphram between the actuator and valve seats.

Only one deformable diaphram was employed. However, the piezoelectric bender of the plural port valve was formed of a comb-like configuration with the arms or bender portions joined along one end by a bridge while the tines extend in a generally common plane when installed, to cooperate with the spherical impacting member to deform only that portion of the common diaphram sealingly engaged over each valve seat. More precision in operation could be obtained if the piezoelectric benders could be individually adjusted. This is enabled by the invention. With such adjustment one can adjust tension, position, etc. for the control of fluid at each valve. Compensation should be provided for fatigue of certain members as well as the differences in force required to be exerted to seat and unseat the various ball valves constituted by the individual impacting members depending upon their position and relative location in the overall valve body.

Proper mounting and relative positioning of individual piezo benders is required if same are to be employed. Secure mounting of each bender and proper angular orientation of each bender at its correct distance from its associated ball or impacting member is essential.

Improved versatility can be obtained if the multiple valve could be operated as a normally open and/or normally closed valve simply by an adjustment of or change in the mounting of the benders. The use of benders in the same print head that operate either as normally closed or normally open valve actuators can be accomplished using individually formed benders disposed to operate one way or the other. Achievement of such versatility is a highly desirable goal provided none of the advantages of the disclosed piezoelectric fluid control device are sacrificed in such achievement.

The fluid control device contemplated is capable of being coupled electrically to an electrical power source. Using multiple tine-like comb units preferably required the electrical connections be made using solder connecting individual electrical leads to the individual benders. High cost is a deterrent to such constructions as is the multiplicity of solder connections required. Of further disadvantage are the failure of the connections equally to withstand fracture attributable to vibration, possibly due to poor soldering, nonuniformity and/or inconsistency in quality of the individual solder connections either in factory or in field handling and operational stress placed thereon, particularly in view of the advantageous high speed use capability. Accordingly, provision of means for effecting an electrical connection in one act by enabling use of a multiple array of printed circuit edge connectors will provide high reliability, economical, positive electrical connection. Additional advantage would be the provision of means rendering one of the benders adjustable independent of others, so that the adjustment of one or more of the benders will not disturb the adjustment of others.

The benders of the piezoelectric fluid control device each operate between two states or conditions, a rest or static condition and a "dynamic" condition, that is, a condition under which the free ends of the benders are moved when electrically energized. It is desirable to mount the fixed ends of the piezoelectric benders in a manner which enables adjustment of the rest or static condition of the bender and adjusting the force exercised by the free end thereof to control the force exercised on the impacting member when the valve is in normally closed condition or to control the force exercised when energized for valves used in a normally open mode.

The characteristics of the valve determine the sealing force required to maintain the valve closed at a given pressure.

It is the intention to provide a singular bender mounting or a multiple bender mounting capable of securing the fixed end of the cantilevered spring-like piezoelectric benders and providing a capability to adjust the force exercizable against the membrane sufficient in respect of a normally open valve operation to overcome the pressure exercised on the membrane by the fluid, when the bender is energized.

It is further intended to provide a mounting which as installed provides a stationary or an adjustable fulcrum point for adjustment and a clamping member cooperating with the fulcrum. The mounting also provides for initial deflection adjustment, the bender being also electrically insulated, i.e. isolated, from adjacent benders. Electrical connection can be effected with cooperating standard printed circuit board edge connectors, a spacer being introduced to compensate for differences in thickness at the connection when the thickness of the normally employed printed circuit board is greater than the thickness of the bender at its fixed end. The mounting and electrical connection are capable of accommodating a single bender, multiple individual benders or a comb-like multiple bender. Where individual mountings are employed, the mounting can include cooperable tongue and grooves to assure alignment and spacing of benders on the valve body relative to the impact members at the valve seats.

SUMMARY OF THE INVENTION

Accordingly, the invention herein provides a piezoelectric operated fluid control device including a valve body plural cantilever mounted planar piezoelectric benders arranged in generally coplanar spaced array, mounted to the valve body by an electrically insulative support having fulcrum means for each bender, means for clamping each bender to said support, said fulcrum and clamping means comprising first and second screw means, and an engagement means on the valve body and the support for aligning said benders with the valve seat they control. A spacer can be seated between the bender and the support to compensate between differences in the thickness between the bender and the entrance of the standard edge connector of a printed circuit card to establish electrical connection to the benders. The support may accommodate a comb-like array of benders or may comprise individual alignable side opening clips capable of receiving individual benders and being keyed to align same with their corresponding valve seat while permitting individual adjustment of the free ends of the benders.

BRIEF DESCRIPTION OF THE DRAWING

FIG. 1 is a diagrammatic perspective representation of a drop on demand fluid control device incorporating the features of the invention herein;

FIG. 2 is an enlarged sectional view of the fluid control device according to the invention shown as a normally closed valve;

FIG. 3 is an enlarged sectional view similar to that of FIG. 2 but shown as a normally open valve;

FIG. 4 is an exploded perspective view of a flow control device according to the invention;

FIG. 5 is a fragmentary view of the piezoelectric bender mounting clip according to the invention with the piezoelectric bender accommodated therein;

FIG. 7B is a fragmentary sectional view showing the integral plural bender array installed.

DESCRIPTION OF PREFERRED EMBODIMENTS

Figure 7A:
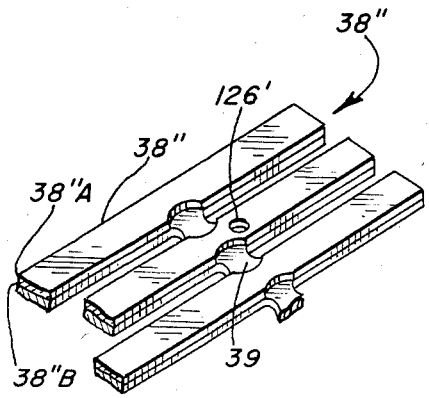
FIGS. 7A and 7B are enlarged views of a modified embodiment of the invention, FIG. 7A being a fragmentary perspective view of an integral plural bender array

Briefly, the invention herein will be described as employed in a piezoelectric valve such as described in my U.S. Pat. No. 4,450,375 of May 22, 1984. The piezoelectric bender is illustrated as a monomorphic type having an upper layer formed of the conventional piezoelectric ceramic material that contracts and expands in response to applied electrical voltage according to classic piezoelectrical theory. The lower half of the bender is formed of stainless steel or similar nonactive material element which neither expands or contracts. One purpose of this invention is to eliminate anticipated damage to the lower section of a conventional bimorph bender due to its impact on the impact ball such as described in the referenced patent, although certainly the invention is not limited thereto. A conventional bimorph bender is formed of two layers of piezoelectric material on a metal foil septum and would require the addition of a protective contact pad to protect against fracture from impacts. Other piezo benders are capable of utilization with the mounting of the invention.

The invention particularly provides mounting/adjusting/positioning means for the benders. While multiple benders could be manufactured much like the tines of a fork or comb, individual benders can be expected to yield the greatest output of defect-free assemblies of multiple benders application. The individual mounting is formed as a generally "U" shaped, nonconductive mounting clip. The bottom side of the clip has two projections which engage two cavities formed in a spacer block secured to the valve body. This orients the bender angularly and at the correct distance with respect to its corresponding impact ball. Around the base of the projection is a shoulder of sufficient height to bottom against the spacer so that the whole mounting can be pivoted about the approximate center of the first mentioned projection. A clamp screw is threaded through the clamp plate so that it can flex the clip tightly against the piezo bender within it and clamp the assembly against the spacer.

For purposes of illustration, assume a normally closed valve. In such case, the valve is pressurized to a value above its operational pressure rating and an adjustment screw is screwed in until the valve is shut off. Then one would manipulate the adjustment locking screw to clamp the mounting clip against the adjustment screw, checking that the valve remained closed. The mounting clip can either be bonded to the bender for accurate positioning of the two relative to each other or by use of a small locating notch on the side of the bender that cooperates with a mating rib in the bottom of the opening in the clip; this can also be accomplished without the need for bonding. There are many ways this important relationship can also be obtained. One might be to insert a mold of the mounting around the bender provided that the molding temperatures do not reach the level where the piezoelectric properties would be downgraded or destroyed. If a normally open valve operation is desired, one would adjust the voltage polarity such that the bender would flex downward when it was applied. Naturally, in such case, the adjust until the valve closes operation would be done with the bender energized.

The mounting additionally acts as an insulator between the edges of adjacent benders by protecting one edge of the bender. In doing so, molding of the mounting clip is facilitated. If the clip were insert molded around the bender, it would naturally and easily cover both edges of the bender. The embodiment illustrated has a subtle and practical advantage since it is of advantage to have the widest possible bender consistent with the center-to-center spacing one is using and the necessary electrical clearance to be maintained. If the width and spacing were 0.080" and 0.100" respectively, the mounting clip would be able to use almost the full (0.020") wall thickness, making for a durable and easily molded part since the upper and lower arms of the mounting would be of that or slightly greater wall thickness. The widths of the upper and lower arms should be slightly less than the width of the bender so that none of this spacing differential (0.20") is wasted.

As will be seen, the adjusting and clamping screws are carried in a clamp plate which is spaced above, parallel to and in accurate alignment with the valve body. This is accomplished by use of spacer sleeves and fastening means. The fastening means extend thru at least a pair of alignment holes in the spacer plate and continue into the valve body which is the source for all the reference locations of all members that cooperate with it.

The spacer plate described has two important functions. First, it must position all the benders in proper angular relationship to and displacement from the ball of the valve that the bender will operate. Secondly, it must vertically position the bender and its attached mounting clip at a suitable height so that they can easily be adjusted and clamped so as to operate as either a normally open or normally closed valve operation.

Another important aspect of the invention is the means provided for electrical connection. Connections to piezoelectric benders have customarily utilized soldered leads. The inherent reliability of these benders has usually been compromised by these soldered connections. Their high cost is very obvious. Their tendency to fail due to vibration induced facturing, poor quality of soldering, in-factory or in-field handling stresses, etc. is a considerable shortcoming. The invention eliminates this problem and also provides flexibility allowing instant removal of all electrical connections for valve servicing or removal by making the bender configured to permit use of standard printed circuit edge connectors to make electrical connection to both sides of piezo benders. The advantage is so great that even if only one bender was being used, the connector means would be of considerable advantage. The connection described makes practical and encourages the assemblage of a multiple array of perhaps 20 or more piezoelectric benders side-by-side, all of which are connected or disconnected in a single quick act. In place of 40 soldered connections whose combined mean time to fail would not be very long, this invention provides a high reliability, spring loaded electrical connection.

To permit the use of the highly desirable, standard P.C. edge connectors, a spacer element is provided should the thickness of the piezo bender be less than the thickness of the standard printed circuit board (typically 1/16") within which the connector is designed to be accommodated. The spacer would fit against the piezoelectric bender and be contained within the mounting. It would extend outward in sufficient length to make contact within the edge connector. If the valves are intended to be a mixture of normally open and normally closed valves, the polarity cannot be the same and naturally the spacer would have to be individual with each bender or at best, common only to those of the same polarity. A spacer also is provided for the case where all the valves are of the same polarity. An important feature of the geometry of the spacer is provision of a weakening notch at the end of the slot required to clear the insulating wall of the mounting. If the spacer had any appreciable thickness, failure to include this weakening notch could create a condition whereby the spacer would resist the easy flexure required for ease and accuracy of adjustment of the bender and equally damaging (in the case of multiple bender applications) would be the tendency of the adjustment of a neighboring bender to affect the adjustment of a previously adjusted bender. Individual spacers would also allow the removal of an individual bender without disturbing its neighbors.

The clamp plate can comprise a narrow strip covering the clamping area of the bender(s) or can be an extended member protecting the ends of the bender. The clamp plate should have sufficient stiffness to render the adjustments independent of the clamping forces required for subsequent clampings and adjustments.

Referring to FIG. 1, there is illustrated a preferred embodiment of the invention that is identified generally by the reference character 10. The device 10 provides for high speed operations and accuracy with precise open and closing times. The piezoelectric drive mechanism, that provides the high speed operation and accuracy, actuates the device 10 without being in contact with the fluid to be controlled, thereby avoiding mechanical and chemical problems with the piezoelectric member. The fluid control device 10 includes a generally rectangular housing 12, a fluid inlet port 14, a plurality of fluid outlet ports 16, an electric power connection 18 via a printed circuit board edge connector 20 and a source of fluid under pressure 15.

Enclosed within the housing 12 is a generally rectangular valve body 24 having a chamber 26 (FIGS. 2 and 3) communicating with the input port 14 and the dispensing orifice 30 (FIG. 2), a common membrane 32, a valve plate 34, a spacer plate 36, a piezoelectric driver or bender 38, an impacting ball 40 (FIGS. 2 and 3), and clamping plate 42. The fluid is contained entirely within the chamber 26 and the communicating passageway defined in the valve body 24. The impacting balls 40 and benders 38 are isolated from the fluid by the membrane 32. A valve seat 44 is defined within the chamber 26 of valve body 24. The valve seat 44 is substantially coplanar with the generally planar surface 46 of the valve body 24 with through passage 26' concentric with chamber 26.

The membrane 32 is a strong, pliable sheet member and can be formed of a polymer material, such as the material sold under the registered trademark TEFLON by Dupont Company, or any of many other of various available elastomers or rubbers and extends over all the valve seats and that portion of surface 46 that surrounds chambers 26 and connecting passageway 27. The material for the membrane 32 is selected on the basis of abrasion resistance and chemical compatability with the fluid as well as its elasticity and resilience characteristics. The membrane 32 corresponds in dimension to the rectangular valve plate 34. The membrane 32 is thin, for example 0.015 inches, and is secured to the upper, generally planar surface of the valve body 24 and is arranged movably and resiliently in a vertical plane relative each of the valve seats 44. The membrane 32 also functions as a gasket by sealing around the openings for the chambers 26 and the connecting passageway 27. The membrane 32 provides a fluid-tight seal at each valve seat 44 with the respective impacting ball 40 exerting a predetermined force on said membrane 32.

The valve plate 34 is provided with openings 50 adapted to be aligned with threaded passages 54 formed in the valve body 24 and suitable openings 56 in membrane 32 to permit passage thereinto of mounting screws 52, thereby to couple the valve plate 34, membrane 32 and the valve body 24, additionally to provide clamping around the chambers 26. The use of mounting screws 52 conveniently enables exchanging of the membrane 32 should it become necessary.

Threaded sockets 54' are provided in the valve body 24 opening to the surface 57 opposite surface 46 to receive mounting screws 58 for coupling a nozzle plate 60 thereto with a gasket 62 sandwiched therebetween. The through passage 26' communicates between valve seat 44 and dispensing orifice 30. The gasket 62 includes, additional to passageways 26'', passageways 54'' permitting mounting screws 58 to pass therethrough into socket 54. Passageways 64 are provided in the nozzle plate 60 located to be aligned with passageways 26' and 26''. The passageway 64 has an entrance 30' having a diameter wider than the opening 64 to define an annular shelf 66. Wafer 68 carrying a precise aperture 70 is tightly received in entrance 30' and bottomed on annular shelf 66. The aperture 70 includes a flared portion defined by the tapered wall 72 defining the outlet 30. The wafer 68 preferably is recessed from the outer surface 74 of nozzle plate 60.

The valve plate 34 is provided with third openings 75 to retain the impacting members 40 in position concentric with the valve seat 44 in the valve body 24 and in a vertical plane therewith. The valve plate 34 is rectangular in configuration and is dimensioned to be spaced from one edge of the body 24 to accommodate spacer plate 36.

The piezoelectrical benders 38 are plural individual rectangular monomorph bands. The piezoelectric benders are arranged in a generally common horizontal plane cantilever arranged side-by-side mounted to the spacer plate 36 with their free ends 76 extending horizontally past the balls 40 as illustrated in FIGS. 2 and 3. Each piezoelectric bender 38 is formed of a pair of flat wafers 38A, 38B superimposed and bonded together. Wafer 38A is formed of a ceramic material laid on an electrically conductive wafer 38B such as formed of stainless steel, for example. The number of wafers in a stack determines the total force that can be generated by each bender 38. The total force that can be generated by the piezoelectric bender 38 increases in proportion to the number of piezoelectric layers in each stack. The number of piezoelectric benders 38 is selected to satisfy the operating requirement of the particular valving or flow control application. The piezoelectric benders 38 are each seated in a respective clip 82 and assembled for connection electrically with opposite polarity on each member. Multiple layer benders can be connected in series or parallel within the skill in the art.

The electrical power connection 18 is provided by use of conventional printed circuit board edge connector 20. Each piezoelectric bender 38 has a rearwardly directed extension 38'. The upper and lower surfaces of the piezoelectric bender 38 at the extension are connected to the printed circuit board edge connector 20. The piezoelectric bender 38 is cantilever mounted at its fixed end to the spacer plate 36. The free-end 76 of the piezoelectric bender 38 is arranged to move toward and away from the impacting member 40 in predetermined relation to the polarity and level of the applied voltage. The amplitude of the movement or deflection of the free-end of the piezoelectric bender 38 increases corresponding to increases in the level of the applied voltage, so that fluid control device or the particular valve thereof can be used as a "throttle" valve by varying the level of the applied voltage.

As mentioned, the valve plate 34 of size and dimension is to be spaced inward of the periphery of the valve body 24 to accommodate spacer plate 36. A row of spaced, threaded passageways 78 is formed in valve body 24 for accommodating set screws 80. The spacer plate 36 is provided with a row of through passageways 84 and an adjacent row of sockets 86, the passageways 84 being aligned coaxially with passageways 78 in the valve body 24. Passageways 84 have a greater diameter than passageway 78 so that the screws 80 are freely movable in said passageways 84.

According to the herein invention, each of the individual piezoelectric benders 38 is mounted to the spacer plate 36 by identical mounting clip members 82. Each clip 82 is formed by a conventional plastic molding process of U-shaped configuration and has generally rectangular overall configuration including a side wall 88 and a pair of coextensive top and bottom legs 90,92 defining a side opening groove 94. An interior rib 96 is formed on the side wall 88 interior of the groove 94. Each bender 38 has a notch 96' thereon adapted to receive the rib 96 when the bender 38 is seated fully within groove 94.

A pair of depending projections 98 and 100 are formed on the bottom of leg 92 of the mounting clip 82 and are located to be received in passage 84 and socket 86 of the spacer plate 36 respectively so that each bender 38 is located properly angularly and at the correct distance from the respective ball 40. A shoulder 100' is defined around the base of the projection 100. Shoulder 100' is of sufficient height to bottom against the spacer plate 36 at 102. This enables the mounting clip 82 to be pivoted slightly about the center of said projection 100. Ideally, shoulder 100' should only contact spacer plate 36 at two points perpendicular to the axis of bender 38. Clip 82 bears on its leg 90 by the pairs of set screws 104,106 threaded through suitable pairs of threaded passageways 108 formed in plate 42. The set screws 106 function to effect the clamping of the piezoelectric bender 38 seated in clip 82 pivotably against the spacer plate 36. The setscrew 104 functions as an adjusting screw to set the force exercised on the impacting member 40 by the free end 76 of the bender 38 so that the particular valve seat 44 controlled thereby is closed.

FIG. 2 illustrates the flow control device 10 in normally closed condition. The piezoelectric bender 38 is mechanically deflected and holding the impacting member 40 against the membrane 32 and membrane 32 against the valve seat 44 with the power source deactivated. The bender 38 is arranged to provide a fluid-tight sealed engagement between the membrane 32 and the valve seat 44 with the electrical power source deactivated. The free end 76 of the piezoelectric bender 38 is caused to further deflect and move away from the impacting member 40 by activating the electrical power source, thereby providing a path for fluid flow from chamber 26, through passages 26', 26" and the outlet 30.

FIG. 3 illustrates the fluid control device 10 in normally open condition wherein the piezoelectric bender 38 is arranged to provide a path for fluid flow from chamber 26, through passages 26', 26" and through outlet 30 when the power source is deactivated. The free end 76 of the piezoelectric bender 38 is caused to deflect and move toward the impacting member 40 by activating the electrical power source, thereby throttling the fluid flow from chamber 26. At a predetermined level of applied voltage, the free end 76 of the piezoelectric bender 38 moves the impacting member 40 against the membrane 32, such that the membrane 32 exerts a fluid-tight sealing force on the valve seat 42 and closes chamber 26.

The polarity of the electrical connection 18 determines the direction of movement of the deflectable portion of the piezoelectric bender 38.

Referring to FIG. 4, the valve body 24 is represented in more detail showing plural fluid control devices, here five in number, each having an individual piezoelectric bender 38. A chamber 99 is formed in the surface 46 of valve body 24 connected to the input port 14 via passageway 28 and along groove 110 to the five chambers 26A, 26B, 26C, 26D and 26E in whose centers valve seats 44A, 44B, 44C, 44D and 44E are defined. The threaded passageways 54 are shown as capable of receiving the mounting screws 52. The single membrane 32 is secured to the upper generally planar surface 46 of the body 24 so that it is resiliently movable in the vertical plane relative to the respective valve seats 44A et al.

Valve plate 34 is shown provided with a row of circular openings 75 for alignment with the chambers 26 and balls 40 which are seated with their centers concentric with the chambers 26 and the passageways 26'. The valve plate also carries mounting holes 50 formed therein arranged to be aligned with the threaded passageways 54. The valve plate 34 may be selected to be of dimension sufficient to cover the entire surface 46 of the valve body 24 (combining valve plate 34 and spacer plate 36) or may be dimensioned to be spaced inward from one opposite edge of said valve body 24 whereby to enable the accommodation of the spacer plate 36. The spacer plate 36 as illustrated in FIG. 4, is provided with a row of through bores 84 and an adjacent row of top opening sockets 86. The piezoelectric benders 38 are each seated with compensator 112, within their respective lip members 82 and the respective projections of each clip member 82 seated in their respective passages 84 and sockets 86.

The clamp plate 42 is placed over the seated clips 82 and accurately positioned and fastened to the valve body 24 by the mounting screws 114 via openings 116 in clamp plate 42 and threaded holes 115 in valve body 24. Suitable spacers 118 are provided. The adjustment screws 104 and clamping screws 106 are received through threaded passageways 108 formed in the clamping plate 42. The ends 117 of said screws 104 and 106 bear against the respective upper surface legs 90 of the clips 82. Once screw 106 has been tightened, tension exerted by the bender on the impacting member either to maintain the same against the diaphragm either normally to open or to seal the respective valve seat 44 is adjusted by manipulation of adjustment set screw 104, and locked by manipulation of locking screw 80, access thereto being available from the undersurface 57 of valve body 24. When the piezoelectric benders 38 are seated within the respective clip 82 and the respective screws tightened as desired, the benders 38 have a vertical angular relationship to the respective impacting member 40. Each bender 38 (and its associated mounting clip 82 are seated at a height sufficient to permit individual adjustment thereof and individual capability of operating as a normally open or normally closed valve.

The conductive compensator element 112 is only required where there is a difference between the thickness of the bender extensions 38' and the desired mating thickness for the side entrance of connecter 20 into which the said extension 38' is to be received. If the valves of the device 10 are intended to be a mix of normally open and normally closed units, the spacer must be individual to each bender.

The extension 38' with the conductive compensator 112 is capable of being force fitted in through entrance 20' of edge connector 20 so that electrical contact is made between the connector elements 122 and 124 and the bender extension 38'. The compensator must be sufficiently flexible to permit the flexure required for ease and accuracy of adjustment of the bender 38 as well as the capability to enable adjustment of an adjacent bender without disturbing the adjustment of its neighbors.

The spacer 112 is provided with weakening notches 132 at the ends of slots 134. The notches 132 are spaced inward of the extensions 138. This expedient eases the resistance to individual flexure and enables each bender to be individually adjusted without affecting the adjacent bender(s).

The clamping screw 106 is tightened against the upper leg 90 of clip 82 to flex same tightly against the piezoelectric bender 38 therewithin and clamp the assembly against the spacer plate 36.

Assuming a normally closed valve operating as illustrated in FIG. 2, the valve would be pressurized to a value above its operational pressure rating and the adjustment screw 104 manipulated until shut off of the valve occurs. The adjustment locking screw 80 is manipulated to force the clip 82 against the adjustment screw 104 assuring that the condition of the valve remains constant. With this valve normally open as shown in FIG. 3, the voltage polarity is reversed from its condition in FIG. 2 with the bender flexing downward when voltage is applied. The same adjustment cycle would be performed with the bender energized.

The multiple valve fluid control devices such as illustrated in FIG. 4 provide for independent, high speed operation and accuracy without residual motion for each of the separate, closely spaced valves.

Figure 7B:
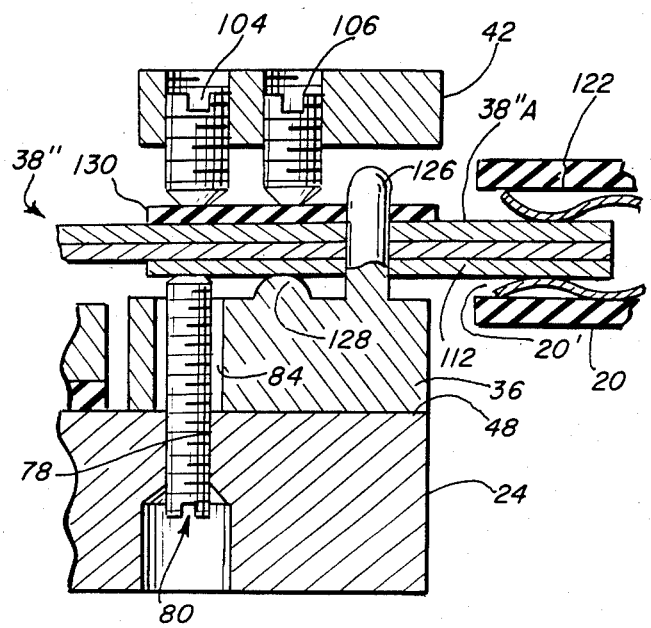

The so-called comb type of multiple piezo bender 38" as illustrated in FIGS. 7 and 7A does not require bender to bender electrical insulation. One cannot, however, employ the comb type in other than a fully normally open or a fully normally closed valve. With the comb type arrangement, the bender portions comprise a piezo ceramic 38"A coated on a conductive substrate 38"B such as stainless steel. Connecting root portions 39 are thin and rounded to reduce stress concentrations and provide maximum flexibility with the ceramic material removed from between root portion 39 of adjacent benders so as to assure electrical independence of the respective benders. The flexibility of the free ends of the individual benders, that is adjustment of the force exercised on the respective ball to assure closure until released (as for a normally closed operation) or required to assure overcoming of closure in a normally open operation, i.e. the force required to be applied to the individual ball to change a normally open condition to an operationally closed condition, is controlled by manipulating adjustment screw 104 and locking the adjustment in a set condition by manipulating screw 80. Optionally, conductive compensator 112 is employed to compensate for differences between the total thickness of the unit consisting of the piezoelectric bender ceramic and substrate and the desired mating thickness for the entrance 20' of the connector 20. Where a comb type bender array is employed, a pair of nonconductive positioning pins 126 are provided spaced on the plate 36 and spaced projections 128 coaxial with clamp screws 106 are effective to define the fulcrum pivoting the bender array members. Suitable openings 126' can be formed in the comb to effect its positioning of angularity and distance to the ball.

A single raised elongate wall or ledge (not shown) can be provided along the length of spacer plate 36 in lieu of projections 128 with clamping screws provided in the clamp plate to fix the fulcrum. When the comb type of bender array is employed a comb 130 of insulating material is spindled on the locating pins 126. By having narrow connecting webs on the insulating comb 130, independence of adjustment is preserved.

As described herein the structure of the invention provides a stationary fulcrum point, such as employed with the comb type bender structure or an array of individual mountings can be used in which case the fulcrum points can be individually adjustable by locating the respective mountings relative the positioning of said mounting clips 82 along the benders.

In addition to providing the adjustment screw for controlling individually the deflection of the bender, a clamp screw is provided to lock in place against self change, the adjustment reached.

With the rearward extension of the bender 38' or bender array, a standard printed circuit edge conductor 20 is employed to effect a secure, spring loaded, electrical connection to the benders, this concept being aided by providing an optional means, such as the conductive compensator 112 to compensate for deviations from the standard thickness to be capable of entry into the standard edge entrance of the conventional printed circuit board connector.

Each adjustment and electrical connection of the piezo benders of the array is independent of the others of said array. Further, operation (using individual benders and individual compensators, if employed) provide the opportunity of employing individually mounted benders enabling the provision of both normally open and normally closed valves in the same valve body.

Figure 6A:
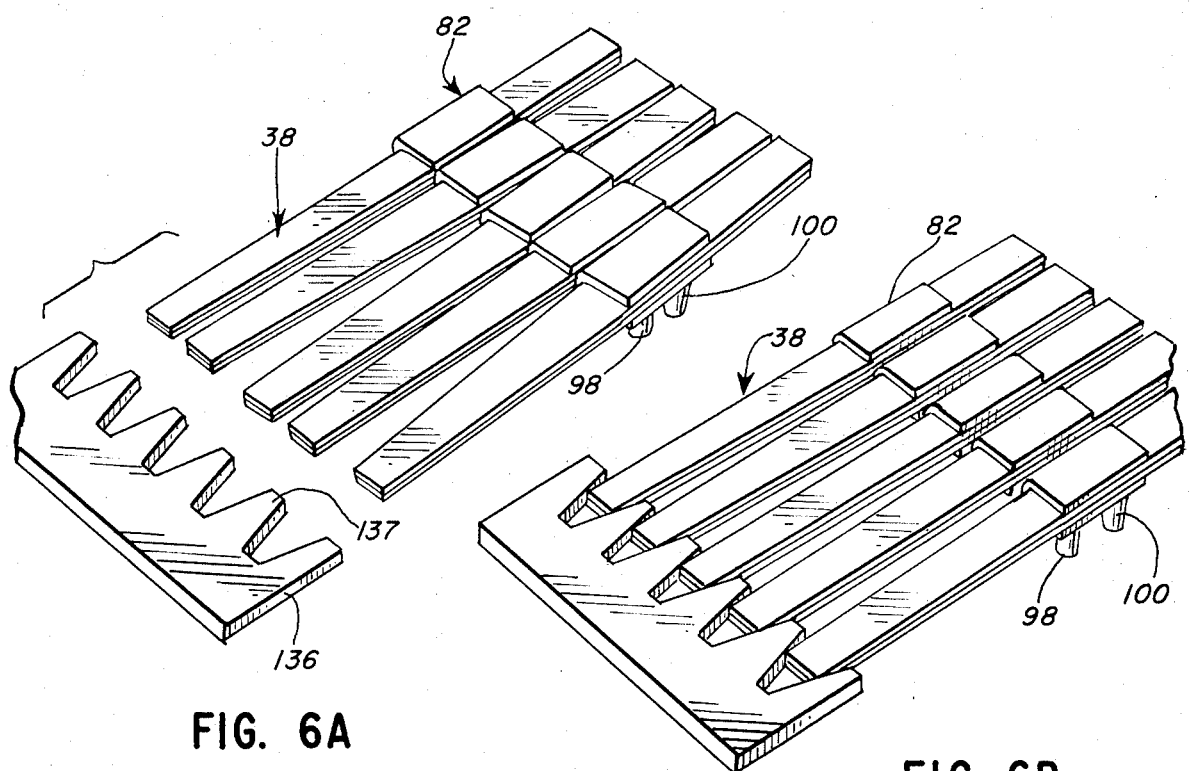
FIGS. 6A and 6B are diagrammatic representations of a plural array of side-by-side arranged benders for a multiple array, FIG. 6A illustrating the array prior to alignment using an alignment tool and FIG. 6B also illustrating the aligned array and said tool.
Figure 6B:
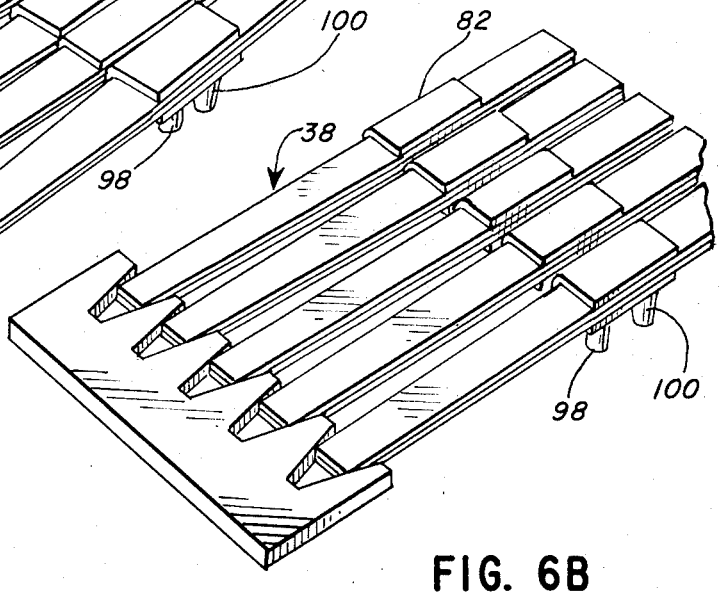

The mounting clip 82 either must be formed very accurately and positioned exactly to center the free end 76 of the bender 38 over the impacting ball 40 with proper spacing from the adjacent benders 82 of the array thereof where multiple benders are employed (with multiple impacting balls, valve chambers and valve seats, etc.). As illustrated in FIG. 6a, the respective benders are shown in their initial nonaligned condition as first assembled between the spacer plate 36 and clamping plate 42 in the course of their assembly to the valve 10. Each of the benders are pivotable horizontally about the fulcrum defined by projection 100 and lightly engaged clamping screw 106. The deflection adjustment screws are not as yet tightened. The effective free ends of the piezo benders are positioned at the proper distance from the fulcrum to position the benders' free ends over the respective impact balls by the location of the pivot or fulcrum. An alignment tool 136 illustrated in FIG. 6 has tapered tines 137 for use properly to align each of the benders with the respective centers of the balls 40 by simply sliding the tool with its tapered tines 137 interposed between the adjacent benders as shown in FIG. 6B. Thereafter, the respective adjustment and clamp screws are tightened.

Alternatively, a multiple valve body (not shown) can be provided with a plurality of inlet ports corresponding to a plurality of outlet ports. The provision of multiple inlet ports could be useful in fluid control logic applications. Individual valve chambers could be connected in series and/or parallel.

Fluid control devices embodying the invention can be employed in a variety of different applications. Among such applications could be selective dispensing of inks, dyes or the like in the computer printing field, controlled dispensing of medicinals from pumps, implanted in a human, for instance, controlling fluid flow in fluidic systems, among others.

What I claim is:

1. In a piezoelectrically operated fluid control device including at least one piezoelectric bender element having a free end and a fixed end, a valve body, the valve body having at least one chamber communicating to a source of fluid under pressure and a valve seat therein, a deformable membrane over the valve seat operable to change the condition of communication to the source of fluid via the valve seat and membrane deforming means isolated from the fluid and placed over the membrane below the free end of the bender element engaged therewith, the improvement comprising means for mounting the fixed end of the bender element onto the valve body including means defining a fulcrum for pivoting the bender element at its fixed end, means for clamping the fixed end of the bender element to the valve body, means cooperable with said clamping means for adjusting the deflection of the free end of the bender element and means for establishing electrical connection to said bender element.

2. The structure of claim 1 wherein said mounting means is formed of electrically insulating material.

3. The structure of claim 1 wherein said means for establishing electrical connection comprises an extension integral with said bender element and having an electrically conductive portion extending from said fixed end capable of slidable engagement with a standard edge connector for a printed circuit board.

4. The structure of claim 1 wherein said mounting means includes depending projection means, and recess means are provided in said valve body cooperating with said projection means for defining said fulcrum and positioning the free end of the bender element relative to the deforming means.

5. The structure of claim 1 wherein a conductive spacer member is disposed between said bender element and said mounting means and extends outwardly of said fixed end thereof coextensive with said extension whereby to compensate for any difference between the thickness of the bender element and extension and the entrance to said standard edge connector.

6. The structure of claim 1 wherein said mounting means comprises a C-shaped member of size and configuration capable of receiving the bender element longitudinally therewithin.

7. The structure as claimed in claim 6 in which there are plural C-shaped members for receiving the respective bender elements, said last mentioned members and benders arranged side-by-side and cooperating means for aligning same.

8. The structure of claim 6 wherein there are a plurality of chambers and valve seats, there being an array of side-by-side disposed bender elements arranged on said valve body, one for each chamber, each bender element being seated within its mounting, each mounting including at least one interior projection, and each bender element having a locating notch cooperating to receive an interior projection therewithin when said bender element is seated in its mounting.

9. The structure of claim 1 and means for axially registering each bender with associated mounting means.

10. The structure of claim 1 in which said means for clamping comprises exterior accessible first set screw means, a clamping bar for receiving said first set screw means, said adjusting means comprising exterior accessible second set screw means secured on the valve body, said first and second set screw means arranged one above the other on opposite sides of said mounting element and said first set screw means being in bearing relation with the mounting element.

11. The structure of claim 10 wherein said fulcrum defining means includes third set screw means and bore means in said clamping bar for receiving said first and third set screw means.

12. The structure of claim 1 wherein there are plural piezoelectric bender elements comprising a unitary comb-like member having a bank of spaced parallel generally coplanar electrically independent piezoelectric bender elements and a trunk unitary with all the ends of the bender elements along one side thereof.

13. The structure of claim 12 wherein all the bender elements are commonly polarized.

* * * * *